:::

United States Patent
Croce et al.

(10) Patent No.: US 6,538,281 B2
(45) Date of Patent: Mar. 25, 2003

(54) LOW ON-RESISTANCE LDMOS

(75) Inventors: Giuseppe Croce, Concorezzo (IT); Alessandro Moscatelli, Casnate con Bernate (IT); Alessandra Merlini, Nova Milanese (IT); Paola Galbiati, Monza (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/862,750

(22) Filed: May 22, 2001

(65) Prior Publication Data

US 2001/0048133 A1 Dec. 6, 2001

(30) Foreign Application Priority Data

May 23, 2000 (EP) .............................. 00830373

(51) Int. Cl.⁷ ............................................. H01L 31/119
(52) U.S. Cl. ..................... 257/335; 257/327; 257/337; 257/378
(58) Field of Search .................. 257/327, 328, 257/335, 337, 338, 370, 378

(56) References Cited

U.S. PATENT DOCUMENTS

| | | |
|---|---|---|
| 3,387,286 A | 6/1968 | Dennard |
| 4,672,410 A | 6/1987 | Miura et al. |
| 4,683,486 A | 7/1987 | Chatterejee |
| 4,866,492 A | 9/1989 | Quigg ........................ 357/23.4 |
| 4,873,560 A | 10/1989 | Sunami et al. |
| 4,943,841 A | 7/1990 | Yahara |
| 4,969,032 A | 11/1990 | Scheitlin et al. |
| 5,308,782 A | 5/1994 | Mazure et al. |
| 5,317,180 A * | 5/1994 | Hutter et al. ................ 257/327 |
| 5,369,045 A | 11/1994 | Ng et al. ........................ 437/41 |
| 5,517,046 A | 5/1996 | Hsing et al. ................ 257/336 |
| 5,825,065 A * | 10/1998 | Corsi et al. .................. 257/327 |
| 6,144,065 A * | 11/2000 | Kinzer ........................ 257/327 |
| 6,169,309 B1 * | 1/2001 | Teggatz et al. ............. 257/328 |

FOREIGN PATENT DOCUMENTS

| | | | |
|---|---|---|---|
| DE | 1184800 | 1/1965 | |
| EP | 0537684 | 4/1993 | ......... H01L/29/784 |
| JP | 47-39134 | 4/1968 | |

OTHER PUBLICATIONS (no author), Recent Developments at the National Bureau of Standards . . . , p. 85 & 138–141, Nov. 1953, Tele–Tech & Electronic Industries.
Shah et al, A 4–Mbit DRAM with Trench–Transistor Cell, p. 618–626, Oct. 1986, IEEE Journal of Solid State Circuits.
Banerjee et al, Leakage Mechanisms in the Trench Transistor DRAM Cell, p. 108–116, Jan. 1988, IEEE Transactions on Electron Devices.
Richard C. Jaeger, Introduction to Microelectronic Fabrication, p. 136–138, Feb. 1990, Modular Series on Solid State Devices (vol. 5).

* cited by examiner

Primary Examiner—David Nelms
Assistant Examiner—Dao H. Nguyen
(74) Attorney, Agent, or Firm—Allen, Dyer, Doppelt Milbrath & Gilchrist, P.A.; Lisa K. Jorgenson

(57) ABSTRACT

An LDMOS structure is formed in a region of a first type of conductivity of a semiconductor substrate and comprises a gate, a drain region and a source region. The source region is formed by a body diffusion of a second type of conductivity within the first region, and a source diffusion of the first type of conductivity is within the body diffusion. An electrical connection diffusion of the second type of conductivity is a limited area of the source region, and extends through the source diffusion and reaches down to the body diffusion. At least one source contact is on the source diffusion and the electrical connection diffusion. The LDMOS structure further comprises a layer of silicide over the whole area of the source region short-circuiting the source diffusion and the electrical connection diffusion. The source contact is formed on the silicide layer.

12 Claims, 3 Drawing Sheets

ELECTRONS

HOLES

Silicide

P-body
n+
N-pocket

LOW ON-RESISTANCE LDMOS

FIELD OF THE INVENTION

The present invention relates to integrated circuits, and in particular to an LDMOS structure whose enhanced characteristics make it capable of withstanding high currents while retaining a low on-resistance.

BACKGROUND OF THE INVENTION

A laterally diffused metal oxide semiconductor (LDMOS) structure is formed by a drain region, a source region and a gate defined over a channel region. Most commonly, the source region is formed by a P-body diffusion formed inside an N-pocket region. A N+ source diffusion is formed inside the P-body, and a source contact is established with the N+ diffusion. This type of structure has a number of drawbacks because during the normal functioning of the device, the potential of the N+ diffusion normally differs from the potential of the body diffusion.

In order to improve the performance of a power LDMOS, particularly when operating at relatively high currents, the N+ and P-body diffusions should be short-circuited locally. According to FIG. 1, this may be attained by forming an electrical connection by way of a P+ diffusion that extends through the N+ source diffusion and reaches the P-body region that is short-circuited to the N+ diffusion by the source contact.

Such a locally established short-circuit between the N+ and P-body diffusions is a customary technique implemented in VSLI technology where the size of the contacts are large enough to establish the desired contact with both the P+ and N+ diffusions.

With the development of ULSI technologies, the size of the contacts have been reduced to allow for a greater density of integration, and as a result, the N+ and P+ diffusions may hardly be short-circuited by a single contact.

As a result, known ULSI LDMOS structures encompass source regions with contacts on the N+ diffusions and contacts on the P+ diffusions, as shown in FIG. 2. As illustrated, the central contact of the source region is almost exclusively formed on the P+ diffusion, whereas the other two source contacts are formed on the N+ diffusion. The local short-circuit between the P+ and N+ diffusions is therefore established through a common source contact metallization.

Such an approach has the drawback of causing the current to be nonuniform in the source region because, as shown in FIG. 3, the charge carriers are collected through distinct contacts. This reduces the robustness of the device when operating at high currents because of a premature turning on of the intrinsic parasite NPN.

Moreover, the layout of the contacts in the source region, which in known LDMOS structures are generally aligned as shown in FIG. 2, influences the value of the on-resistance.

In a scheme like this, the on-resistance is proportional to the pitch between the source contacts and the drain contacts, and inversely proportional to the width W of the drain and source regions. Once the width W of the drain and the source regions are fixed, the on-resistance may be lowered only by reducing as much as possible the distance between such regions within the limits imposed by the fabrication technology.

SUMMARY OF THE INVENTION

Eliminating the source contacts on the N+ diffusions while establishing the necessary local short-circuit between the N+ and P+ diffusions reduces the width of the source region with respect to the eliminated contacts.

Moreover, by eliminating the drain contacts that are commonly formed directly opposite the source contacts on the P+ regions, the distance between the drain regions and the source regions may be further narrowed, thus obtaining an LDMOS structure with a lower on-resistance. In addition, by locally establishing the required short-circuit, a net improvement in terms of current uniformity is achieved because there are only common contacts rather than any separate contacts on the N+ and P+ diffusions.

The present invention achieves all this and effectively overcomes the problem of the current being nonuniform in the source region while providing for a markedly lower on-resistance as compared to known LDMOS structures.

More specifically, the object of the present invention is to provide an LDMOS structure formed in a region of a first type of conductivity of a semiconductor substrate. The LDMOS structure comprises a gate, a drain region and a source region. The source region is formed by a body diffusion of a second type of conductivity formed inside the first region, and a source diffusion of the first type of conductivity formed inside the body diffusion. A diffusion of a second type of conductivity is in a limited area of the source region, which functions as an electrical connection that extends through the layer of the source diffusion and reaches the body region. At least one source contact is established with the source diffusion and with the electrical connection diffusion.

According to an essential aspect of the LDMOS structure of the invention, a layer of silicide present over the whole source region area short-circuits the source diffusion and the electrical connection diffusion while the source contact is established with the silicide layer.

According to a preferred embodiment of the invention, the source contact is projectively formed over the area of the electrical connection diffusion. Of course, the LDMOS structure of the invention may comprise a number of uniformly spaced drain contacts on respective drain regions, and a number of uniformly spaced source contacts on respective source regions, alternated in the overall layout of the structure with drain regions.

Optionally, the source contacts may not be aligned with the drain contacts on the adjacent drain regions, and the source regions and the drain regions may be advantageously widened with respect to the respective contacts. In this case, the gates will be geometrically defined along the wavy boundaries of the source regions widened with respect to the source contacts.

BRIEF DESCRIPTION OF THE DRAWINGS

The various aspects and advantages of the invention will become even clearer through a detailed description of the invention and by referring to the attached drawings, wherein.

DETAILED DESCRIPTION OF THE PREFERRED EMBODIMENTS

The present invention exploits the so-called SALICIDE (Self Aligned Silicide) technique that is employed in the fabrication of ULSI CMOS devices. Basically, the invention includes completing the different diffusions that form the source region as formerly described, and thereafter depositing a layer of silicide of very low resistivity onto the N+ and P+ diffusions, thus short-circuiting them.

When operating at high currents, the LDMOS structure of this invention performs outstandingly better than the known LDMOS structures because of a superior uniformity of distribution in the semiconductor of the source current flowing into the source contact. Indeed, the source current in a large measure reaches the metal contact by passing through the silicide layer, which by offering a much lower resistance than the silicon makes the P+ and N+ diffusions more uniformly crossed by the current. This favorable condition enhances robustness of the device under heavy load conditions.

Figure 1:
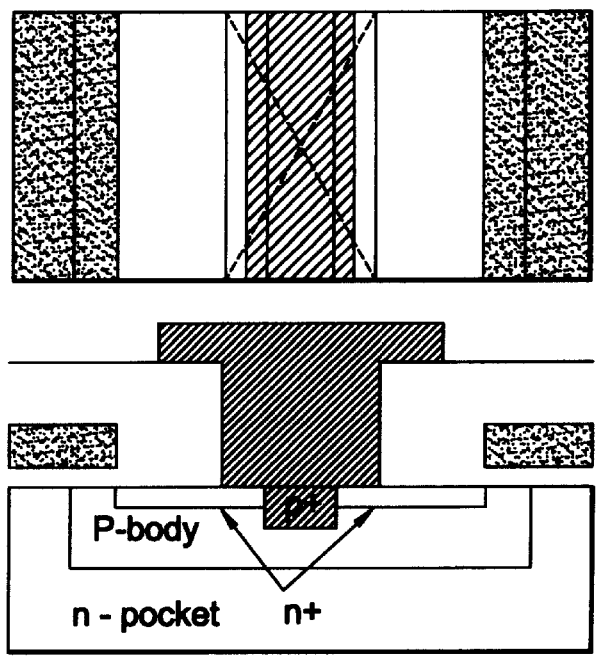
FIG. 1 shows the structure of an LDMOS according to the prior art.
Figure 2:
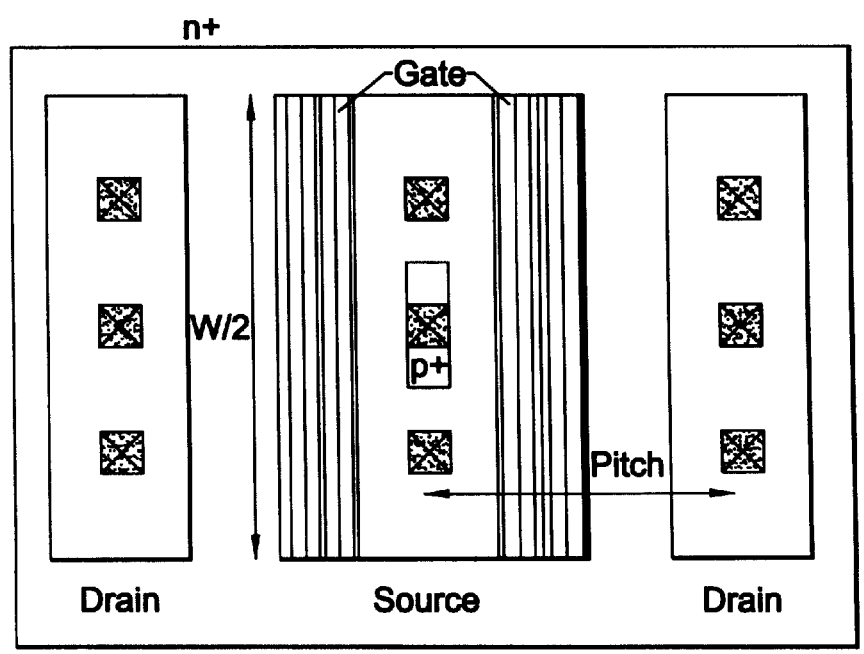
FIG. 2 illustrates the general layout of an LDMOS according to the prior art.
Figure 3:
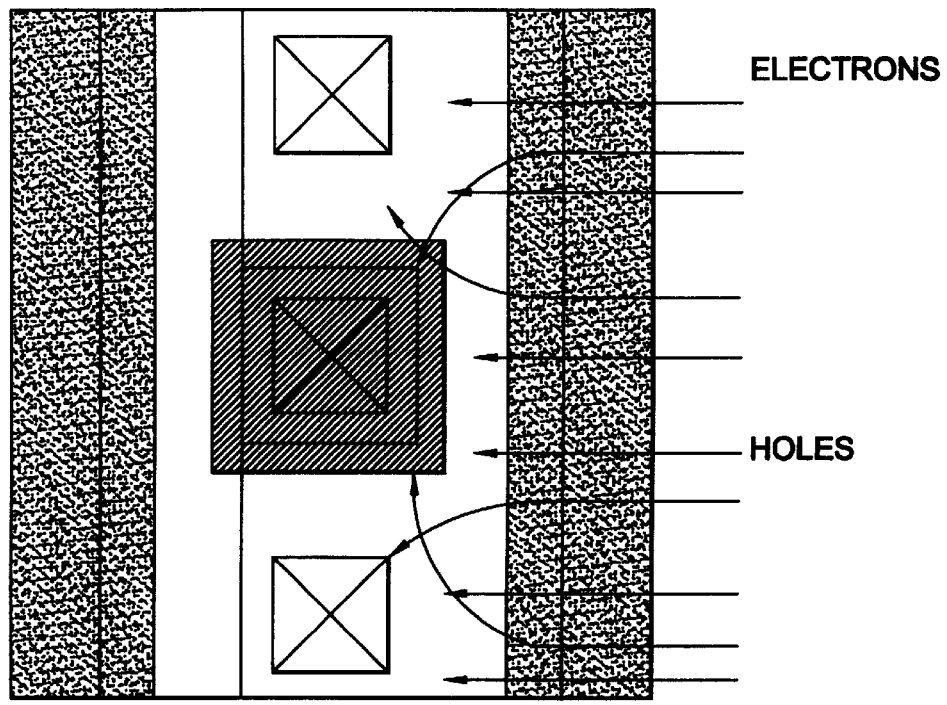
FIG. 3 is a layout of a known source architecture for an N-channel ULSI LDMOS according to the prior art.
Figure 4:
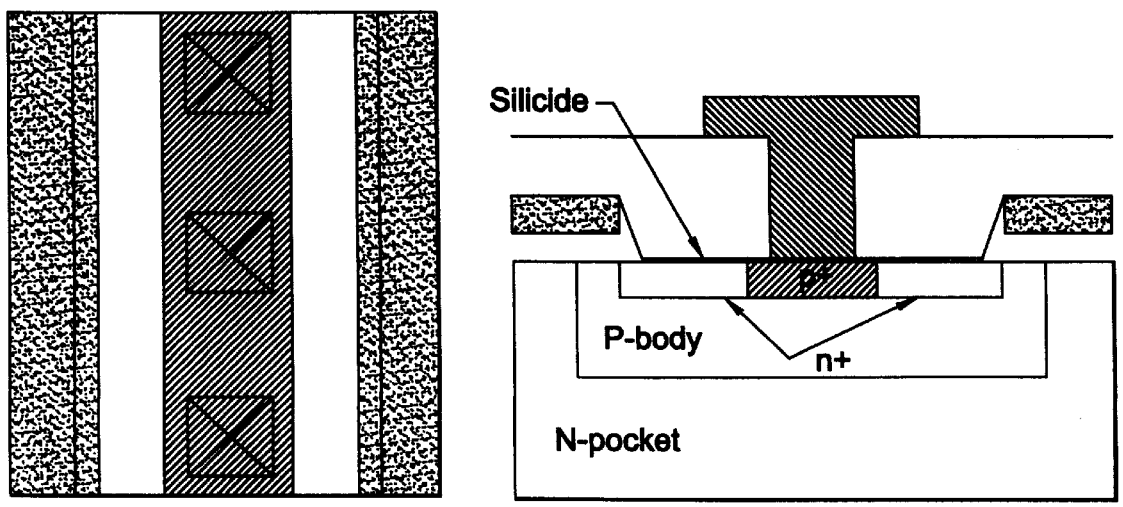
FIG. 4 shows the architecture of the source region of the LDMOS structure according to the present invention.

The invention may be conveniently applied even to ESD structures, in which the nonuniform distribution of the current is one of the main limitations of their performances. Differently from known structures, in the source region of the structure of the invention, as represented in FIG. 4, the N+ and P+ diffusions are no longer short-circuited by a relatively large metal contact, as is the case in VLSI LDMOS, nor by way of separate contacts short-circuited by the overlying metallization. In the structure of this invention the short-circuit is realized locally by a layer of silicide.

Because separate contacts on the N+ and P+ regions are no longer needed and the local short-circuiting is realized through a layer of silicide, the current distribution is uniform because the flux of charge carriers does not split toward distinct points of collection (multiple contacts).

Figure 5:
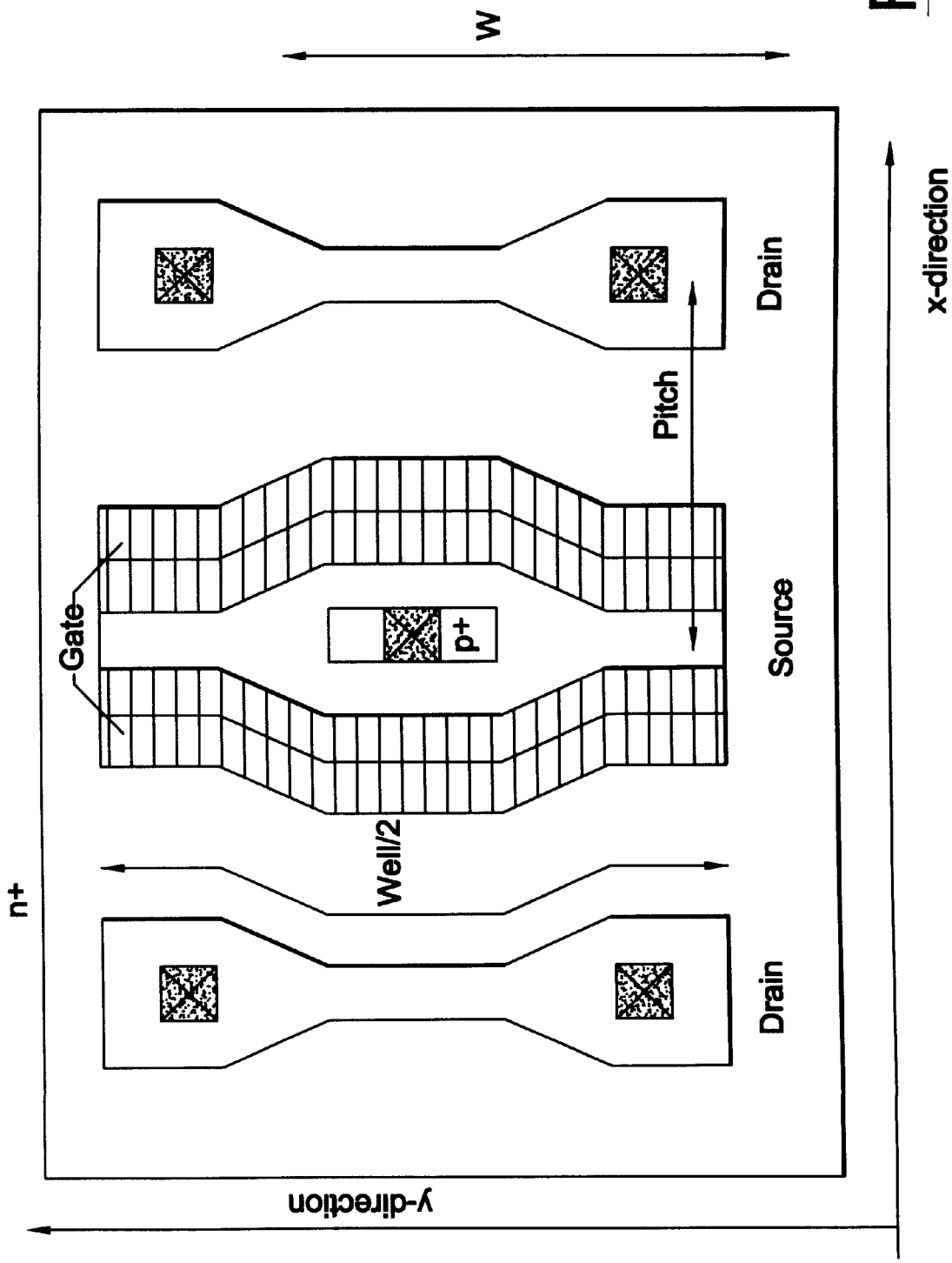
FIG. 5 illustrates a preferred layout of an LDMOS structure according to the present invention.

According to a further aspect of this invention, elimination of the contacts on the N+ diffusions that are normally present in known ULSI LDMOS structures permits restriction of the width of the source region with respect to such diffusions. This allows a layout as that shown in FIG. 5, in which the drain contacts directly opposite the source contacts on the P+ diffusions are eliminated and the width of the drain region is reduced complementarily to the source region boundary.

In this way, it is possible to reduce the distance of separation (PITCH) between the source region and the drain region and to increase the width WEFF/2 of the zone in the silicon crossed current because of the wavy form of the boundary of the source region in the y direction.

As compared to existing LDMOS structures, this additional feature of the structure of this invention allows for a 5 to 15% reduction of the separation distance between the drain region and the source region and for an increase of about 10 to 15% of the width WEFF. This leads to a reduction by about 20% of the product between the on-resistance of the device and the required area of silicon.

That which is claimed is:

1. An LDMOS structure comprising:
    a first region comprising a semiconductor material of a first type of conductivity;
    a drain in said first region;
    a gate on said first region; and
    a source comprising
        a body diffusion region of a second type of conductivity within said first region,
        a source diffusion region of the first type of conductivity within said body diffusion region,
        an electrical connection diffusion region of the second type of conductivity in said source diffusion region,
        at least one source contact layer connected to said electrical connection diffusion region and comprising a layer of silicide over upper portions of said source diffusion and electrical connection diffusion regions and electrically connecting said source diffusion and electrical connection diffusion regions together, and
        a source contact on said silicide layer and having a width less than a width of said silicide layer.

2. An LDMOS structure according to claim 1, wherein said source contact is over said electrical connection diffusion region and the width of said source contact is less than a width of said electrical connection diffusion region.

3. An LDMOS structure according to claim 1, wherein said drain region comprises a plurality of drain regions and a plurality of corresponding drain contacts uniformly spaced thereon; and wherein said source region comprises a plurality of source regions and a plurality of corresponding source contacts uniformly spaced thereon that alternate in a spaced apart relationship with said plurality of drain contacts.

4. An LDMOS structure according to claim 3, wherein said plurality of source contacts are not aligned with said plurality of drain contacts.

5. An LDMOS structure according to claim 3, wherein a width of each of said plurality of source and drain regions adjacent a respective contact is larger than a width of said plurality of source and drain regions not adjacent a respective contact.

6. An LDMOS structure according to claim 3, wherein said gate is geometrically defined along boundaries of said source regions.

7. An LDMOS structure comprising:
    a first region comprising a semiconductor material of a first type of conductivity;
    a drain in said first region;
    a source comprising
        a body diffusion region of a second type of conductivity within said first region,
        a source diffusion region of the first type of conductivity within said body diffusion region,
        an electrical connection diffusion region of the second type of conductivity in said source diffusion region,
        a layer of silicide over upper portions of said source diffusion and electrical connection diffusion regions and electrically connecting said source diffusion and electrical connection diffusion regions together, and
        a source contact on said silicide layer and over said electrical connection diffusion region, said source contact having a width less than a width of said electrical connection diffusion region.

8. An LDMOS structure according to claim 7, further comprising a gate on said first region.

9. An LDMOS structure according to claim 8, wherein said gate is geometrically defined along boundaries of said source regions.

10. An LDMOS structure according to claim 7, wherein said drain region comprises a plurality of drain regions and a plurality of corresponding drain contacts uniformly spaced thereon; and wherein said source region comprises a plurality of source regions and a plurality of corresponding source contacts uniformly spaced thereon that alternate in a spaced apart relationship with said plurality of drain contacts.

11. An LDMOS structure according to claim 10, wherein said plurality of source contacts are not aligned with said plurality of drain contacts.

12. An LDMOS structure according to claim 10, wherein a width of each of said plurality of source and drain regions adjacent a respective contact is larger than a width of said plurality of source and drain regions not adjacent a respective contact.

* * * * *

UNITED STATES PATENT AND TRADEMARK OFFICE
CERTIFICATE OF CORRECTION

PATENT NO. : 6,538,281 B2  Page 1 of 1
DATED : March 25, 2003
INVENTOR(S) : Giuseppe Croce et al.

It is certified that error appears in the above-identified patent and that said Letters Patent is hereby corrected as shown below:

<u>Title page,</u>
Item [56], References Cited, delete:
"
        U.S. PATENT DOCUMENTS 3,387,286 A   6/1968   Dennard
        4,672,410 A   6/1987   Miura et al.
        4,683,486 A   7/1987   Chatterejee
        4,873,560 A  10/1989  Sunami et al.
        4,943,841 A   7/1990   Yahara
        4,969,032 A  11/1990  Scheitlin et al.
        5,308,782 A   5/1994   Mazure et al.

FOREIGN PATENT DOCUMENTS

DE      1184800   1/1965
        JP       45-39134  4/1968

OTHER PUBLICATIONS (no author), Recent Developments at the National Bureau of Standards . . . , p. 85 & 138-141, Nov. 1953, Tele-Tech & Electronic Industries.
Shah et al, A 4-Mbit DRAM with Trench-Transistor Cell, p. 618-626, Oct. 1986, IEEE Journal of Solid State Circuits.
Banerjee et al, Leakage Mechanisms in the Trench Transistor DRAM Cell, p. 108-116, Jan. 1988, IEEE Transactions on Electron Devices.
Richard C. Jaeger, Introduction to Microelectronic Fabrication, p. 136-138, Feb. 1990, Modular Series on Solid State Devices (vol. 5). "

Signed and Sealed this

Second Day of December, 2003

JAMES E. ROGAN
*Director of the United States Patent and Trademark Office*